INVENTOR.
JOHN H. GRABOWSKI
BY Roger W. Jensen
ATTORNEY

Dec. 21, 1965 J. H. GRABOWSKI 3,225,216

CONTROL APPARATUS INCLUDING A SWITCH AND BOTH POSITIVE AND NEGATIVE FEEDBACK

Filed Sept. 6, 1962 2 Sheets-Sheet 2

INVENTOR.
JOHN H. GRABOWSKI
BY Roger W. Jensen
ATTORNEY 3,225,216

CONTROL APPARATUS INCLUDING A SWITCH AND BOTH POSITIVE AND NEGATIVE FEEDBACK

John H. Grabowski, Minneapolis, Minn., assignor to Honeywell Inc., a corporation of Delaware Filed Sept. 6, 1962, Ser. No. 221,732
10 Claims. (Cl. 307—88.5)

This invention pertains generally to amplifiers and more particularly to switching amplifiers or switching apparatus.

When an amplifier is used in a switching application, positive feedback is often utilized to speed up the switching action. The positive feedback produces an effect in the switching transistor or amplifier which is quite similar to that obtained when using a voltage or signal to turn a relay "on" and "off." In other words, the input signal required to turn the switching amplifier to an "on" condition is a much higher level or amplitude than is the case when the signal voltage is decreasing and it is desired to turn the switching amplifier to an "off" condition. This voltage differential between the "on" signal amplitude and the "off" signal amplitude is commonly termed the "hysteresis effect." The same effect is true in a relay in which more current or voltage is required to turn the relay to an "on" condition than is required to deenergize the relay.

This invention uses positive feedback to turn the switching amplifier to an "on" condition. It then uses negative feedback which is delayed in time with respect to the switching action to provide an equal amount of negative feedback to counterbalance or cancel the effect of the positive feedback to thereby reduce the hysteresis effect of the switching amplifier to a desired amount. In any case the hysteresis effect can be greatly reduced or made negative using this technique. As the voltage is lowered, after the previous switching action has taken place, the positive feedback again acts to increase the speed of switching the amplifier to an "off" condition and then soon afterward the negative feedback again cancels out the positive feedback effect and places the amplifier in its original condition ready to switch to the opposite condition again.

It has also been found that the same circuit, with only a change in resistance values in the negative feedback loop so as to provide more negative feedback than positive feedback, will provide a pulse width modulated switching amplifier. In this application, the input signal determines the width of the pulse since the voltage differential between the input signal and a reference potential determines the delay time of the application of the negative feedback. When the negative feedback is applied the switching amplifier turns to an "off" condition and stays in that condition until a capacitor in the negative feedback loop recharges to allow the switching circuit to turn to an "on" condition again.

One object of this invention is to provide improved switching apparatus in which the voltage switching differential is minimized.

Various other objects and advantages will appear from the following description of the invention, and the novel features will be particularly pointed out hereinafter in connection with the appended claims and drawings in which:

Figure 1:
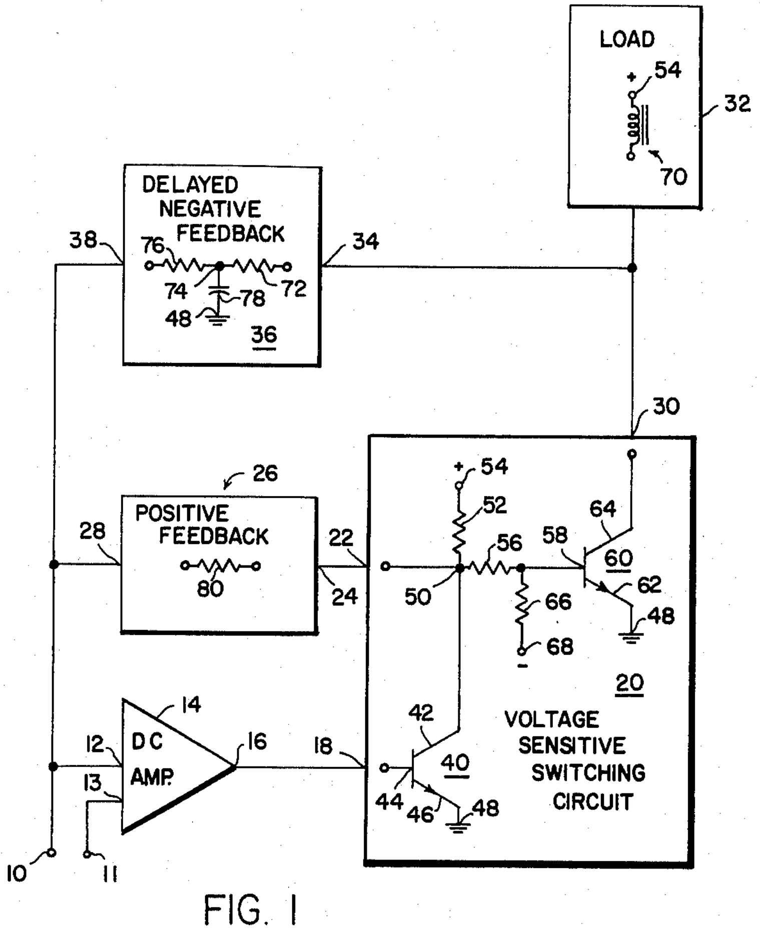
FIGURE 1 is a block diagram of a simplified version of the invention.

Referring first to FIGURE 1, inputs 10 and 11 are connected to inputs 12 and 13 of a D.C. amplifier or differential amplifier means 14. The amplifier means 14 has an output 16 connected to an input 18 of a voltage sensitive switching circuit means generally designated as 20. An output 22 of the switching circuit means 20 is connected to an input 24 of a positive feedback means 26. An output 28 of the positive feedback means 26 is connected to the input 12 of amplifier 14. Another output 30 of the switching circuit 20 is connected to a load generally designated as 32 and also to an input 34 of a delayed negative feedback circuit generally designated as 36. An output 38 of the feedback circuit 36 is also connected to the input 12 of amplifier 14. A transistor 40 contained within the switching circuit means 20 has a collector 42, a base 44, and an emitter 46. The emitter 46 is connected to ground 48 while the base 44 is connected to the input 18 of the switching circuit 20. The collector 42 is connected to the output 22 of the switching circuit 20 and also to a junction point 50. A resistance means or impedance means 52 is connected between a positive power terminal 54 and the junction point 50. A resistance element or impedance means 56 is connected between the junction point 50 and a base 58 of a transistor 60 having an emitter 62 and a collector 64. A resistance element or impedance means 66 is connected between the base 58 and a negative power supply or terminal means 68. The emitter 62 of transistor 60 is connected to ground 48 while the collector 64 is connected to the output 30 of the switching circuit 20. Within the box labeled load 32 is shown a representation of a relay 70 which is connected between the input of the block 32 and a positive power supply which may in some instances be the same as power supply terminal 54 of box 20. The relay 70 is merely one type of load and as well known many other types could be substituted in place of this particular one. Within the negative feedback box 36 there is contained a resistance element or impedance means 72 which is connected between the input 34 and a junction point 74. A resistance element or impedance means 76 is connected between the junction point 74 and the output 38. A capacitive means or impedance means 78 is connected between the junction point 74 and ground 48. An impedance means or resistance means 80 is shown connected between the input and output terminals 24 and 28 respectively of the feedback box generally designated as 26.

The amplifier 14 which is shown is of a type which will give the opposite polarity output when compared with the input signal. One such type which can be used is a differential amplifier such as will be described in FIGURE 2.

Figure 2:
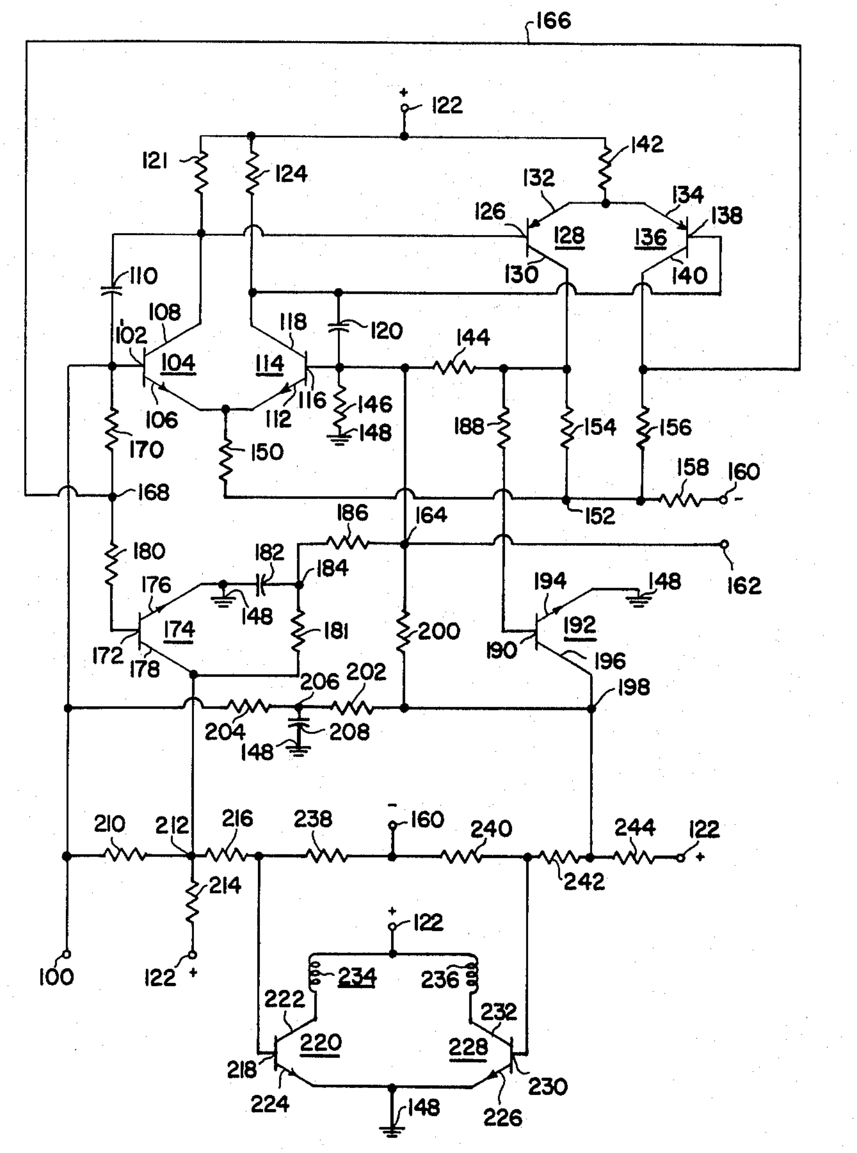
FIGURE 2 is a schematic diagram of one embodiment of a circuit which may be used to practice this invention.

In FIGURE 2 an input 100 is connected to a base 102 of a valve means, amplifying means or NPN transistor 104 which has an emitter 106 and a collector 108. A capacitive element or impedance means 110 is connected between the base 102 and the collector 108 of transistor 104. The emitter 106 of transistor 104 is connected to an emitter 112 of a valve means, amplifying means or NPN transistor 114 having a base 116 and a collector 118. A capacitive element or impedance means 120 is connected between the collector 118 and the base 116 of transistor 114. A resistance element or impedance means 121 is connected between a positive power terminal means 122 and collector 108 of transistor 104. A resistance element or impedance means 124 is connected between the positive power terminal 122 and the collector 118 of transistor 114. The collector 108 of transistor 104 is connected to a base 126 of a valve means, amplifying means, or PNP transistor means 128 having a collector 130 and an emitter 132. Emitter 132 of transistor 128 is connected to an emitter 134 of a valve means, amplifying means, or PNP transistor means 136 having a base 138 and a collector 140. A resistance means or impedance means 142 is connected between the emitter 132 of transistor 128 and positive power supply means 122. A feedback resistor 144 is connected between the collector 130 of transistor 128 and base 116 of transistor 114. A resistance means or impedance means 146 is connected between the base 116 of transistor 114 and ground 148. A resistance means or impedance means 150 is connected between the emitter 106 of transistor 104 and a junction point 152. A resistance element or impedance means 154 is connected between the collector 130 of transistor 128 and the junction point 152. Another resistance element or impedance means 156 is connected between the collector 140 of transistor 136 and the junction point 152. A further impedance means or resistance element 158 is connected between the junction point 152 and a negative power supply means 160. A second input terminal or input means 162, which in some instances may be grounded, or it may be left floating or in other instances it may be the source of an actual signal input, is connected to the base 116 of transistor 114 and to a junction point 164. The collector 140 of transistor 136 is connected by a lead 166 to a junction point 168. A feedback resistor means or impedance means 170 is connected between the junction point 168 and the base 102 of transistor 104. Junction point 168 is also connected, through an impedance means or resistance means 180, to a base 172 of a valve means, amplifying means, switching means or NPN transistor 174 having an emitter 176 and a collector 178. The emitter 176 of transistor 174 is connected to ground 148. A resistance element or impedance means 181 is connected in series with a capacitive means or impedance element 182 between ground 148 and the collector 178 of transistor 174. A junction point 184 between the resistance 181 and the capacitor 182 is connected to one end of a resistance means or impedance means 186 which has its other end connected to junction point 164. A resistance means or impedance means 188 connects the collector 130 of transistor 128 to a base 190 of a valve means, amplifying means, switching means or NPN transistor 192 having an emitter 194 and a collector 196. The emitter 194 is connected to ground 148 while the collector 196 is connected to a junction point 198. A resistance element or impedance means 200 which supplies positive feedback to the input is connected between the junction point 198 and the junction point 164. Two resistance means or impedance elements 202 and 204 respectively which are part of a negative feedback loop are connected in series between the junction point 198 and input 100 and have a junction point 206 between them. A capacitor means or impedance element 208 is connected between the junction point 206 and ground 148. An impedance element or resistance means 210 is connected between the input 100 and a junction point 212 which is further connected to collector 178 of transistor 174. The positive power terminal 122 is connected to junction point 212 through a resistance means or impedance means 214. A resistance element or impedance means 216 connects junction point 212 to a base 218 of a valve means, switching means, amplifying means, or NPN transistor means 220 which has a collector 222 and an emitter 224. The emitter 224 of transistor 220 is connected to ground 148 and also to an emitter 226 of a valve means, switching means, amplifying means, or NPN transistor means 228 having a base 230 and a collector 232. A load means 234 which in this embodiment takes the form of a relay is connected between the collector 222 of transistor 220 and the positive power supply 122. A further load means 236 which may be similar to load means 234 is connected between the collector 232 of transistor 228 and the positive power supply 122. The base 218 of transistor 220 is connected to the negative power terminal 160 through a resistance means or impedance means 238. An impedance means or resistance means 240 is connected between the negative power supply 160 and the base 230 of transistor 228. A further resistance means or impedance means 242 is connected between the base 230 and junction point 198. A resistance means or impedance means 244 is connected between the junction point 198 and positive power means 122.

Figure 3:
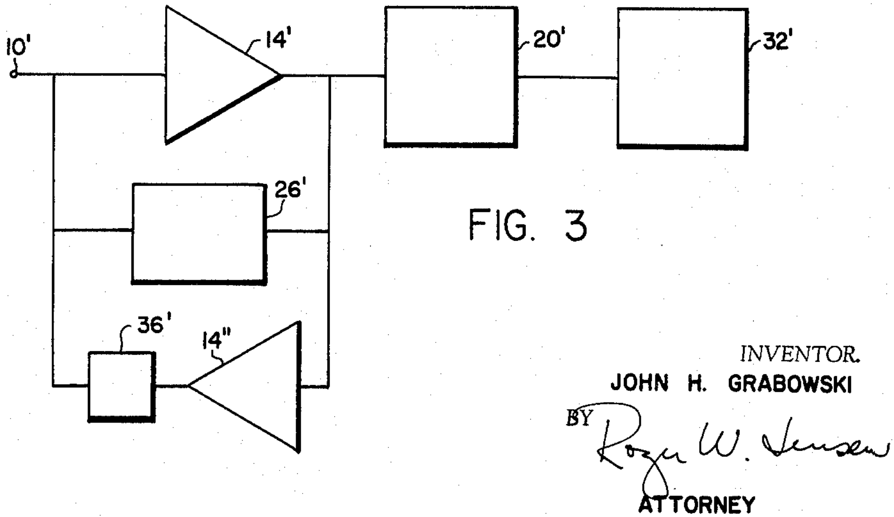
FIGURE 3 is a block diagram illustrating another embodiment for providing negative feedback in the circuit of FIGURE 1.

In FIGURE 3 an input 10′ is shown connected to an amplifier 14′. A positive feedback circuit designated as 26′ is connected between the output and the input of the amplifier 14′. Another amplifier 14″ is connected in series with a delayed negative feedback circuit 36′ between the output of amplifier 14′ and the input thereof. A switching circuit or switching means 20′ is connected to the output of the amplifier 14′ and controls the operation of a load means 32′. As may be surmised from the primes, the numbers in the primed condition refer to the corresponding circuits shown in FIGURE 1. That is, they can be the same as the circuits shown for FIGURE 1 or they may be other circuits which will perform the same function.

*Operation*

The operation of FIGURE 1 will first be described in an embodiment wherein the feedback from the positive and negative paths are equal. If a rising input signal is applied to terminal 10 the output appearing at 16 which is an originally high voltage will start decreasing. The original high voltage will keep transistor 40 in an "on" or fully saturated condition. As the input increases in amplitude and the signal applied to transistor 40 decreases, the point will be reached where the transistor 40 will start to turn to an "off" condition. As transistor 40 turns to an "off" condition the potential at junction point 50 starts to rise. This rise in amplitude of signal at junction point 50 when fed back to the input 10 through positive feedback means 26 aids the input signal and enhances the switching action. When the transistor 40 is in a fully saturated condition, junction point 50 is at a voltage near ground. The voltage dividing action of resistance means 56 and 66 between junction point 50 and negative terminal 68 keeps base 58 of transistor 60 below ground to keep transistor 60 in an "off" condition. When the switching action occurs, the junction point 50 is raised to a level far enough above ground to raise the base 58 to a potential which is positive with respect to emitter 62 of transistor 60. This action turns transistor 60 to an "on" condition to allow current flow through the load 32 and thereby drop the potential of collector 64 to a point near ground 48. With transistor 60 originally in an "off" condition and the collector 64 nearly at the value of the voltage applied at input terminal 54, the capacitor 78 in the negative feedback loop will be charged to the positive power supply voltage. As soon as transistor 60 turns to an "on" condition, the capacitor 78 will begin discharging to bring the potential of junction point 74 down to the potential of collector 64. When the capacitor 78 is discharged to the potential of the collector 64, the feedback signal being obtained from output 30 of the switching means 20 will be of a value such that the current through the negative feedback path is of an amplitude equal to the current through the positive feedbauk path. With the circuit as shown here, the input signal has to be with reference to a reference potential which is below ground. This reference potential may be obtained by connecting terminal 11 to a negative voltage or alternatively using some other means to counteract the steady state current from the negative feedback circuit 36. If, however, it is desired to have the input signal be with respect to ground the emitters 46 and 62 of transistors 40 and 60 must be placed at some potential which is negative with respect to ground in order that the collector 64 and the collector 42 be of opposite potentials at any given time to thereby cause the occurrence of opposite flow directions to travel through the feedback paths. Since the negative feedback current is effective to cancel the positive feedback current, the circuit will again switch as the input signal lowers with respect to the reference potential. As mentioned before if the negative feedback is not supplied, the positive feedback will tend to provide an additional positive signal with respect to ground into the input 12 of amplifier 14 such that the input signal applied at terminal 10 has to be an amount lower than the "on" switching signal necessary to counteract the positive feedback signal in order to switch the circuit to an "off" condition. Since the negative feedback counteracts the positive feedback signal, the circuit will now switch to an "off" condition at the same potential that it switched to an "on" condition.

It may be desirable to have a definite amount of hysteresis effect in the "on" and "off" switching characteristics and this can be accomplished by making the negative feedback any amount less than the positive feedback to produce the desired amount of switching hysteresis.

FIGURE 3 shows an alternate method of performing the function of FIGURE 1 whereby the switching circuit 20′ can be of any type necessary to control the load. If power transistors are used in amplifier 14′, it may be an amplifier and switching circuit so that 20′ is not required. The positive feedback is applied around amplifier 14′ in a conventional manner. This signal may then be reversed with an operational amplifier 14″ and then delayed through network 36″ to provide a feedback current equal to but of opposite direction to that current supplied by positive feedback circuit 26′ after a suitable time delay.

Referring back to FIGURE 1, if the negative feedback circuit provides a current which is of a larger amplitude than the positive feedback circuit, the circuit will then switch to an "off" condition after the delay time has expired. Under the original assumed conditions of a rising input signal, the negative feedback loop will provide a negative going signal and increase the potential at base 44 of transistor 40 an amount necessary to turn the transistor to an "on" condition. With transistor 40 turned to an "on" condition the transistor 60 will then turn to an "off" condition. After the delay time of network 36, a current of the opposite direction will be applied to input 18 to turn transistor 40 to an "off" condition again. This action produces what is commonly known as pulse width modulation as the circuit will continuously turn from an "off" condition to an "on" condition and back again. The time of the "on" period will depend on the voltage difference between that applied to terminal 10 and that appearing at output 30 of switching circuit 20. It is this voltage differential and value of resistors 76 and 72 which determines how long it must take before the capacitor 78 is discharged enough to allow current flow through resistors 76 and 72 greater than that supplied by the positive feedback circuit and thereby change the condition of the switch 20.

As can readily be determined the same effect will be produced by the circuit shown in FIGURE 3 if the amplifier 14″ in combination with the circuit 36′ produces a larger feedback current than does positive feedback circuit 26′.

FIGURE 2 shows the circuit diagram for performing the operations described in conjunction with FIGURES 1 and 3. If a signal is applied to terminal 100 and terminal 162 is open circuited, collector 108 will decrease in potential as the input at 100 increases. This action causes an increase in potential at the collector 130 of transistor 128. This signal is fed back through resistor 144 to the base 116 of transistor 114. This feedback action is for the purpose of stability and is not part of the aforementioned positive feedback or the negative feedback loop. The increasing potential at collector 130 attempts to turn the transistor 192 further "on". However, since transistor 192 is already in a saturated condition nothing further will happen. The input signal at transistor 104, which rises in amplitude, causes a correspondingly opposite reaction at the collector 118 of transistor 114 in typical differential amplifier action. That is, the collector 118 of transistor 114 increases in amplitude while the collector 140 of transistor 136 decreases in amplitude. This decreasing signal is applied through lead 166 to transistor 174 and starts turning the transistor 174 towards an "off" condition. This causes collector 178 of transistor 174 to rise in potential and start turning transistor 220 to an "on" condition. The rise in potential at collector 178 also results in feedback through resistor 210 to the input terminal 100 and back to the base 102 of transistor 104. This feedback action decreases the time of the switching action and thereby reduces the power dissipation in transistors 174 and 220. Transistor 174 is now in an "off" condition and transistor 220 is in a saturated or "on" condition such that power is being supplied to the load 234. Since the collector 178 is near the potential of positive terminal 122, the capacitor 182 starts charging from its previously low voltage to the voltage between ground and positive terminal 122. This signal is applied to the differential amplifier through resistor 186 to the base 116 of transistor 114. Even though it was mentioned previously that input 162 is not used for other purposes such as an input signal, this increasing voltage across capacitor 182 results in cancelling the effect of the positive feedback signal obtained through resistor 210. If the resistance of 210 is equal to the total resistance of 181 added to the resistance of resistance element 186, the total effect on the differential amplifier will be cancelled. As is realized by those skilled in the art, a differential amplifier operates only on the difference in potential between the inputs of the two portions of the differential amplifier and not on the absolute value of the signal at each input with respect to ground. Since both feedback signals are derived from the same source namely collector 178 of transistor 174, when the capacitor 182 is fully charged to the voltage level of collector 178, the total effect on the differential amplifier is cancelled. Now, if the input signal at input 100 decreases to a value such that transistor 174 starts turning to an "on" condition again, the positive feedback action through resistor 210 will increase the speed of this action and later the negative feedback signal through resistors 180 and 186 will cancel out the effect of the positive feedback through resistor 210 so that the cycle can be repeated. If the signal at terminal 100 decreases with respect to ground potential, the opposite effects will occur in the circuit and transistor 228 and accordingly load 236 will be energized instead of load 234 as previously explained.

As mentioned in conjunction with FIGURES 1 and 3, if the negative feedback is increased by decreasing the total resistance of 180 and 186 below the resistance of 210, a continuous switching action will occur in which the width of the "on" pulse is varied as a function of the input signal applied at terminal 100. There is a voltage dividing action between power terminal 122 and input 100 such that with different inputs the voltage at junction point 212 changes depending on the voltage applied to terminal 100 when transistor 174 is in the "off" condition. Junction point 212 will always be at the same potential when transistor 174 is in a saturated or "on" condition. Capacitor 182 must charge up to a value determined by the voltage dividing action between input 100, power terminal 122, and junction point 164 before the negative feedback is sufficient to again switch transistor 174 to an "on" condition. It can readily be determined that the varying input voltage will change the time it takes to charge the capacitor 182 to the value determined by the voltage dividing action of the various named resistors.

The differential amplifier of FIGURE 2 may be used as one means of providing the amplifiers 14, 14′ or 14″ used in FIGURES 1 and 3. Other means of designing amplifiers to perform the desired result are available and it is not intended that this invention be limited to the specific type shown. It will be further understood that various changes in the details, steps and arrangements of parts which have been herein described and illustrated in order to explain the nature of the invention, may be made by those skilled in the art within the principle and scope of the invention and as expressed in the appended claims while staying within the scope of the invention.

I claim:

1. Pulse width modulated apparatus comprising, in combination:

differential amplifier means including input means adapted to provide an output signal;

means for providing an input control signal to said differential amplifier means;

positive feedback means for inducing a regenerative action in said differential amplifier connected to supply an amplified portion of said input signal to said input means of said differential amplifier means;

delayed negative feedback means connected to supply an amplified portion of said input signal to said input means of said differential amplifier means which is delayed in time with respect to the signal provided by said positive feedback means, the time delay being a function of the difference in amplitude between the output and the input signals, the signal being supplied by said delayed negative feedback means being enough larger than the signal being supplied by said positive feedback means to overcome the effect of the input signal and the positive feedback signal for a predetermined period of time; and switching means connected to receive the output signal from said differential amplifier means.

2. Pulse width modulated apparatus comprising, in combination:

differential amplifier means including input means adapted to provide an output signal;

means for providing an input control signal to said differential amplifier means;

positive feedback means for inducing a regenerative action in said differential amplifier connected to supply a feedback signal indicative of said input signal as amplified to said input means of said differential amplifier means;

delayed negative feedback means connected to supply a feedback signal indicative of said input signal as amplified to said input means of said differential amplifier means which is delayed in time with respect to the signal provided by said positive feedback means, the time delay being a function of the difference in amplitude between the output and the input signals; and switching means connected to receive the output signal from said differential amplifier means.

3. Pulse width modulated apparatus comprising, in combination:

amplifier means including input means adapted to provide an output signal;

means for providing an input control signal to said amplifier means;

positive feedback means for inducing a regenerative action in said amplifier means connected to supply an amplified portion of said input signal to said input means of said amplifier means; and delayed negative feedback means connected to supply an amplified portion of said input signal to said input means of said amplifier means which is delayed in time with respect to the signal provided by said positive feedback means, the time delay being a function of the difference in amplitude between the output and the input signals, the signal being supplied by said delayed negative feedback means being enough larger than the signal being supplied by said positive feedback means to overcome the effect of the input signal and the positive feedback signal for a predetermined period of time.

4. Switching apparatus for reducing to a minimum any voltage differential between input "on" and "off" signal levels comprising, in combination:

differential amplifier means including first and second input means and including first and second output means for providing output signals therefrom;

first feedback means for providing positive feedback, said first feedback means being connected from said first output means to said first input means of said differential amplifier means;

second feedback means for providing positive feedback, said second feedback means being connected from said second output means to said second input means of said differential amplifier means;

third feedback means for providing delayed negative feedback, said third feedback means being connected to apply the output signal from said first output means to said second input means of said differential amplifier means;

fourth feedback means for providing delayed negative feedback, said fourth feedback means being connected to apply the output signal from said second output means to said second input means of said differential amplifier means;

switching means including input and output means, said switching means being connected to receive the output signals from said differential amplifier means; and load means connected to said output means of said switching means.

5. Switching apparatus having a minimum switching hysteresis effect comprising, in combination:

switching means including input and output means, said switching means being adapted to change from a first condition to a second condition in a given time as a signal being applied to said input means passes from a first state to a second state;

positive feedback means connected to said switching means for reducing the time required for said switching means to change from one condition to the other condition;

delayed negative feedback means connected to said switching means for cancelling the effect of the positive feedback after said switching means has changed from one condition to the other condition; and load means connected to said output means.

6. In combination:

differential amplifier means including input means adapted to provide an output signal;

means for providing an input control signal to said differential amplifier means;

positive feedback means for inducing a regenerative action in said differential amplifier connected to supply an amplified portion of said input signal to said input means of said differential amplifier means;

delayed negative feedback means connected to supply an amplified portion of said input signal to said input means of said differential amplifier means which is delayed in time with respect to the signal provided by said positive feedback means, the time delay being a function of the difference in amplitude between the output and the input signals; and switching means connected to receive the output signal from said differential amplifier means.

7. In combination:

differential amplifier means including input means adapted to provide an output signal;

means for providing an input control signal to said differential amplifier means;

positive feedback means for inducing a regenerative action in said differential amplifier connected to supply an amplified portion of said input signal to said input means of said differential amplifier means;

delayed negative feedback means connected to supply an amplified portion of said input signal to said input means of said differential amplifier means which is delayed in time with respect to the signal provided by said positive feedback means, the time delay being a function of the difference in amplitude between the output and the input signals; and means for connecting a load means to receive the output signal.

8. Apparatus of the class described comprising, in combination:

switching means including input and output means, said switching means having a given switching time period;

means connected for providing positive feedback to said switching means, said positive feedback means being adapted to decrease the time of the switching period; and circuit means connected for providing negative feedback to said switching means, said circuit means being adapted to apply negative feedback after the switching action is complete to thereby cancel the effects of the positive feedback and thereby reduce to a minimum any voltage differential between levels of input "on" and "off" signals.

9. Apparatus of the class described comprising, in combination:

switching means including input and output means, said switching means having a given switching time period;

means connected for providing positive feedback to said switching means, said positive feedback means being adapted to decrease the time of the switching period; and circuit means connected for providing negative feedback to said switching means, said circuit means being adapted for supplying negative feedback after the switching action is completed.

10. In combination:

amplifier means including input means adapted to provide an output signal;

means for supplying an input control signal to said amplifier means;

positive feedback means for inducing a regenerative action in said amplifier connected to supply a feedback signal indicative of said input signal as amplified to said input means of said amplifier means; and delayed negative feedback means connected to supply an amplified portion of said input signal to said input means of said amplifier means which is delayed in time with respect to the signal provided by said positive feedback means.

References Cited by the Examiner

UNITED STATES PATENTS

| | | | |
|---|---|---|---|
| 2,924,781 | 9/1960 | Wilson et al. | 330—104 |
| 3,002,109 | 9/1961 | Baird | 328—209 |
| 3,111,630 | 11/1963 | Wilcott | 330—104 |

ARTHUR GAUSS, *Primary Examiner.*